(12) United States Patent
Maeda et al.

(10) Patent No.: US 7,391,292 B2
(45) Date of Patent: Jun. 24, 2008

(54) INDUCTORS HAVING INTERCONNECT AND INDUCTOR PORTIONS TO PROVIDE COMBINED MAGNETIC FIELDS

(75) Inventors: Shigenobu Maeda, Seoul (KR); Jeong-hwan Yang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 206 days.

(21) Appl. No.: 10/839,424

(22) Filed: May 5, 2004

(65) Prior Publication Data
US 2005/0017836 A1    Jan. 27, 2005

(30) Foreign Application Priority Data
Jul. 26, 2003    (KR) ............... 10-2003-0051844

(51) Int. Cl.
*H01F 5/00*    (2006.01)
(52) U.S. Cl. ................... 336/200; 336/223; 336/232
(58) Field of Classification Search ........... 336/200, 336/223, 232
See application file for complete search history.

(56) References Cited

U.S. PATENT DOCUMENTS

| | | | |
|---|---|---|---|
| 6,801,114 B2 * | 10/2004 | Yang et al. | 336/200 |
| 2003/0030532 A1 | 2/2003 | Sachio | |
| 2003/0038697 A1 | 2/2003 | Suh et al. | |
| 2003/0210122 A1 * | 11/2003 | Concord et al. | 336/200 |

FOREIGN PATENT DOCUMENTS

JP    2003-045712    2/2003

OTHER PUBLICATIONS

Chinese Patent Application No. 2004-100874079, Office Action dated Nov. 30, 2007.

* cited by examiner

*Primary Examiner*—Ahn T Mai
(74) *Attorney, Agent, or Firm*—Myers Bigel Sibley & Sajovec, P.A.

(57) ABSTRACT

An on-chip inductor includes a main inductor portion configured to provide a main magnetic field of an on-chip inductor. An interconnect inductor portion is electrically coupled to the main inductor portion and is configured to provide an interconnect magnetic field that constructively combines with the main magnetic field.

30 Claims, 7 Drawing Sheets

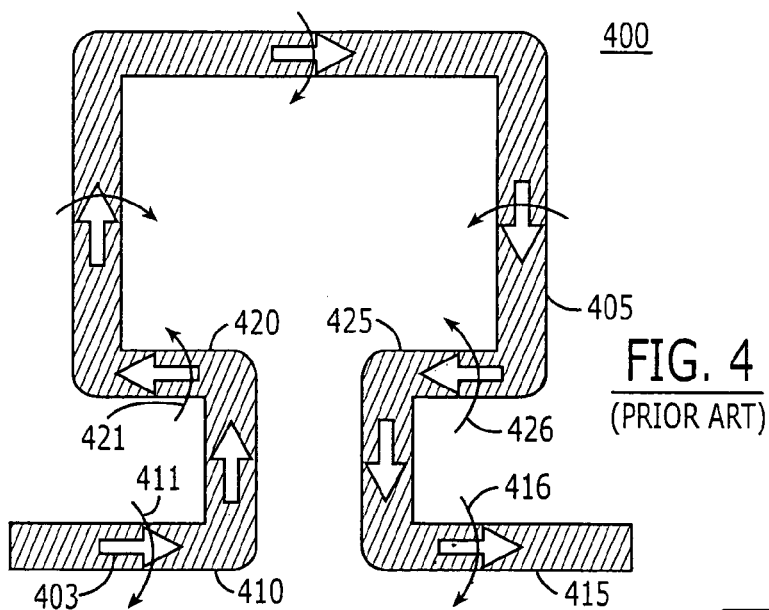
FIG. 4
(PRIOR ART)
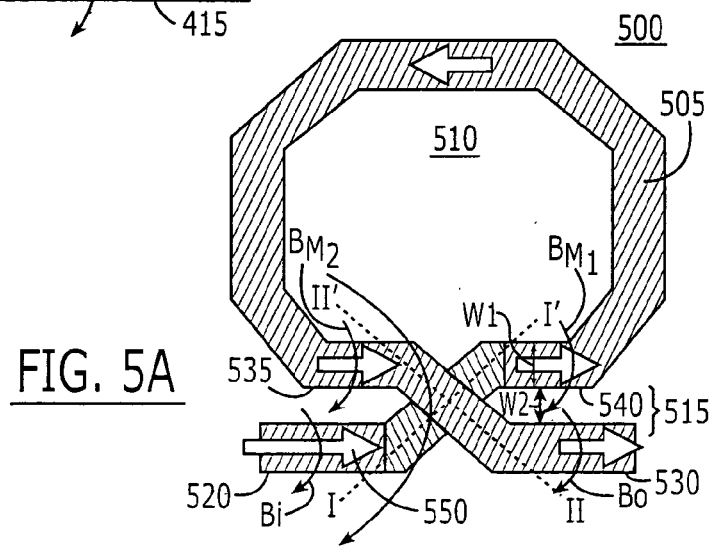
FIG. 5A
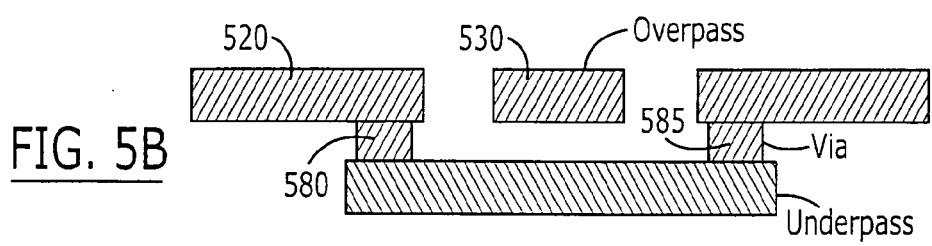
FIG. 5B
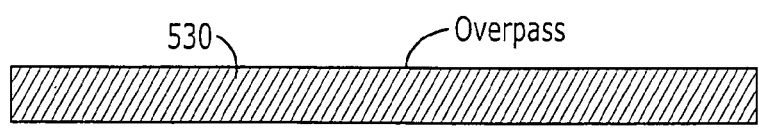
FIG. 5C

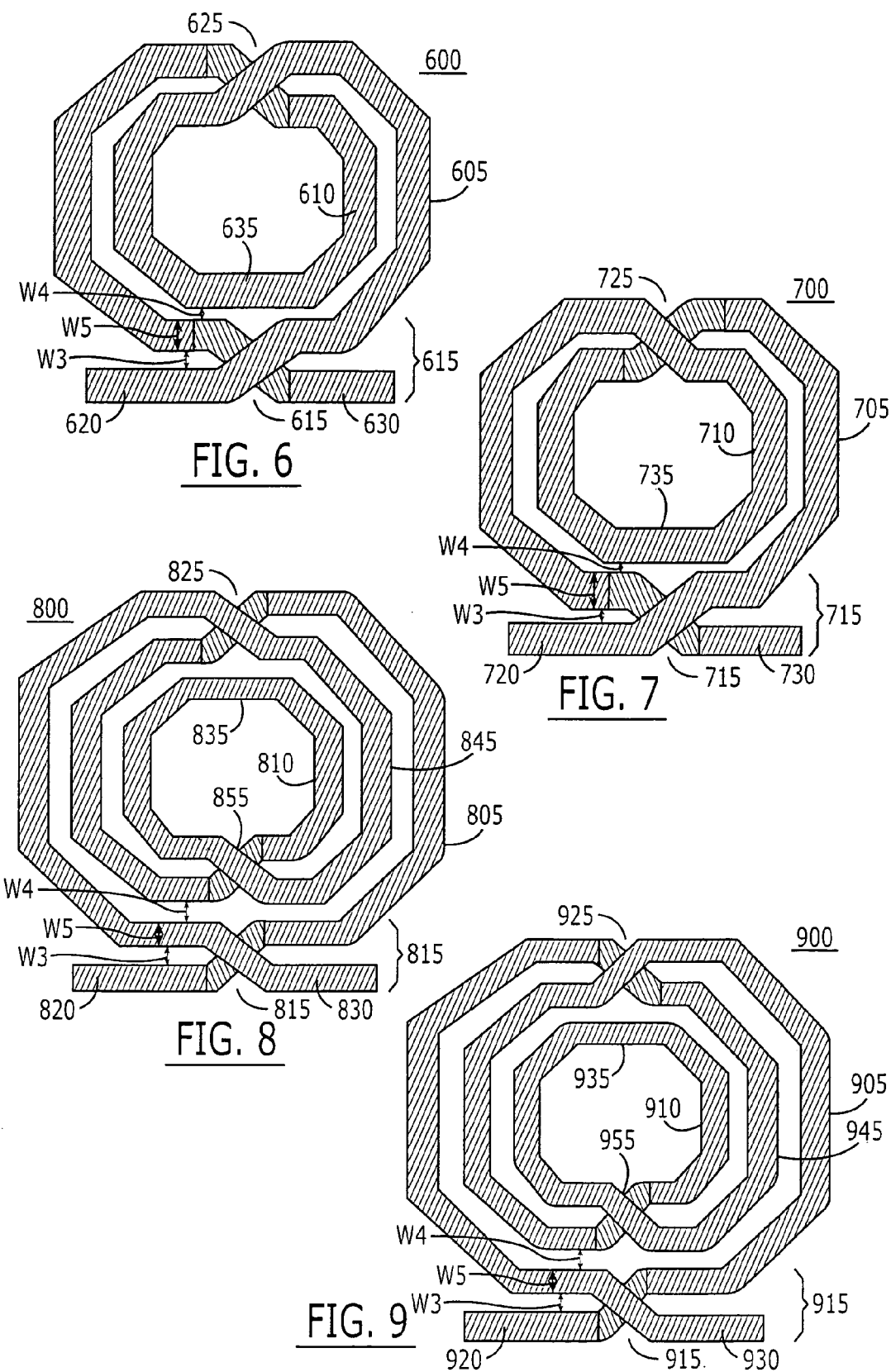

INDUCTORS HAVING INTERCONNECT AND INDUCTOR PORTIONS TO PROVIDE COMBINED MAGNETIC FIELDS

CLAIM FOR PRIORITY

This application claims priority to Korean Patent Application No.: P2003-0051844, filed in the Korean Intellectual Property Office on Jul. 26, 2003, which is incorporated herein by reference.

FIELD OF THE INVENTION

The invention relates generally to the field of electronic components, and more particular, to inductors.

BACKGROUND

Many devices that operate in the Radio Frequency (RF) band utilize electronic components, such as inductors. Inductors can be used in analog portions of the RF circuits, such as Voltage Controlled Oscillators (VCOs). Moreover, as these types of products become more miniaturized, the inductors can be formed in the same semiconductor chip with the RF circuit rather than as a discreet component outside the semiconductor chip that includes the RF circuit.

FIG. 1A is a plan view of a conventional ribbon type inductor that is used in some RF devices. FIG. 1B is an equivalent schematic diagram of the ribbon type inductor, shown in FIG. 1A, that illustrates the parasitic capacitances associated with the ribbon type inductor. Because ribbon type inductors tend to be relatively large, these types of inductors may not be suitable for inclusion in highly integrated RF circuits in semiconductor chips.

FIG. 2 is a plan view of a conventional spiral type inductor that may be used in Complementary Metal-Oxide-Semiconductor (CMOS) circuits. Spiral type inductors are typically characterized by a large inductance due to the fact that the current flows in the same direction throughout the spiral, as shown by the arrows in FIG. 2. Spiral type inductors may also be characterized by small resistances due to the relatively small number of connections used to integrate the inductors with other components. The inductance provided by spiral type inductors may, therefore, be predictable. However, conventional spiral type inductors may also be characterized as having high-parasitic capacitance due to the coupling between the coil and the substrate on which the spiral type inductor is formed.

Another type of conventional inductor is a three-dimensional solenoid type inductor. In general, solenoid type inductors include coils (similar to the spiral inductors discussed above), but the coils are not coplanar. Rather, the coils are spaced apart from one another so that the inductor has a cylindrical shape, such as that associated with a solenoid. Solenoid type inductors may also be characterized as providing a relatively large inductance as the current flows in the same direction within the different coils of the inductor. Although three-dimensional solenoid type inductors can have low capacitance (due to relatively low coupling between the coils of the inductor and the substrate), such conventional inductors can be difficult to fabricate because these need many process steps.

As discussed above, inductors can be used in VCO circuits as part of RF devices such, as radio telephones (or cell phones). As is well known to those skilled in the art, conventional VCO circuits can utilize a symmetrical arrangement of components as shown in schematic circuit diagram of FIG. 3. Non-symmetry in the VCO circuit can cause unbalance of oscillation with regard to two oscillation terminals (out and/ out). This degrades the coherency of the oscillation of the VCO circuit.

Inductors are also discussed in U.S. Patent Application No. US 20030030532 and in Japanese Patent Application JP2003-045712 the disclosures of which are incorporated herein by reference in their entireties.

SUMMARY

Embodiments according to the invention can provide on chip spiral type inductors. In some embodiments according to the invention, the on chip spiral type inductors include a main inductor portion that is configured to provide a main magnetic field and an interconnect inductor portion that is configured to provide an interconnect magnetic field that constructively interferes with the main magnetic field. Accordingly, the constructive interference of the respective magnetic fields provided by the main inductor portion and the interconnect inductor portion can provide an on chip inductor magnetic field that is greater than the main magnetic field.

In further embodiments according to the invention, the on chip spiral inductors can include single or multiple turns. In other embodiments according to the invention, the on chip spiral type inductors include at least one perfect turn. In still other embodiments according to the invention, the spacing between the main inductor portion and the interconnect inductor portion is selected to provide effective constructive interference between the respective magnetic fields. In yet further embodiments according to the invention, the on chip spiral type inductors can include turns having various shapes, such as a rectangular shape, a circular shape, an irregular shape.

BRIEF DESCRIPTION OF THE DRAWINGS

FIG. 4 is a plan view of a conventional open type inductor.

FIG. 5A is a plan view of a spiral type inductor according to some embodiments of the invention.

FIG. 5B is a cross-sectional view of an overpass and underpass portions of the spiral type inductor shown in FIG. 5A according to some embodiments of the invention.

FIG. 5C is a cross-sectional view of overpass and underpass portions of the spiral type inductor shown in FIG. 5A taken along lines II-II' according to some embodiments of the invention.

FIG. 6 is a plan view of a two-turn spiral type inductor according to some embodiments of the invention.

FIG. 7 is a plan view of a two-turn spiral type inductor according to some embodiments of the invention.

FIG. 8 is a plan view of a three-turn spiral type inductor according to some embodiments of the invention.

FIG. 9 is a plan view of a three-turn spiral type inductor according to some embodiments of the invention.

DESCRIPTION OF EMBODIMENTS ACCORDING TO THE INVENTION

Figure 1A:
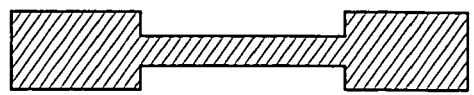
FIG. 1A is a plan view of a conventional ribbon type inductor.
Figure 1B:
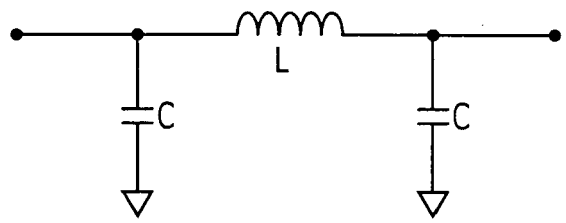
FIG. 1B is a schematic diagram of an equivalent circuit of the conventional ribbon type inductor shown in FIG. 1A.
Figure 2:
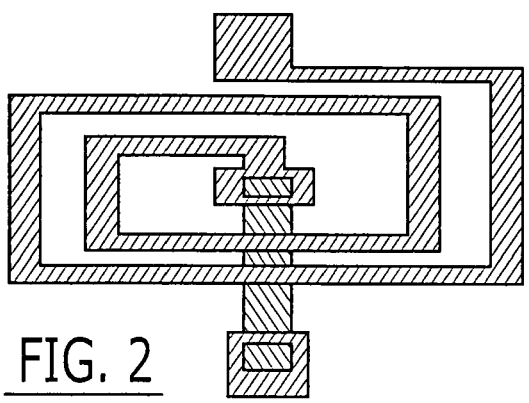
FIG. 2 is a plan view of a conventional spiral type inductor.
Figure 3:
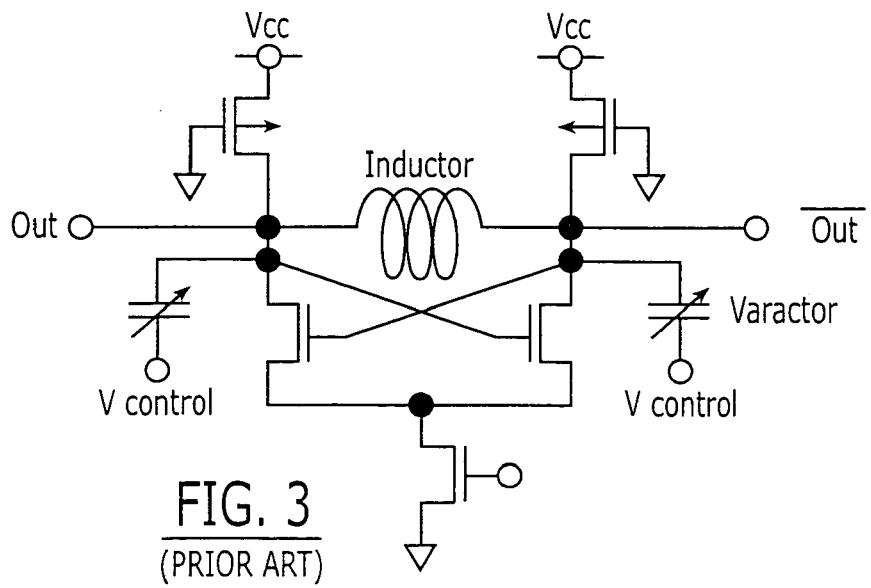
FIG. 3 is a schematic diagram of a conventional voltage controlled oscillator circuit.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being on another element, it can be directly on the other element or intervening elements may also be present.

Furthermore, relative terms, such as "lower" and "upper", may be used herein to describe one elements relationship to another elements as illustrated in the Figures. It will be understood that relative terms are intended to encompass different orientations of the device in addition to the orientation depicted in the Figures. For example, if the device in the Figures is turned over, elements described as being on the "lower" of other elements would then be oriented on "upper" of the other elements. The exemplary term "lower", can therefore, encompasses both an orientation of lower and upper, depending of the particular orientation of the figure.

It will be understood that although the terms first and second may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second without departing from the teachings of the present invention. Like numbers refer to like elements throughout.

Embodiments according to the invention can provide on chip spiral type inductors. In some embodiments according to the invention, the on chip spiral type inductors include a main inductor portion that is configured to provide a main magnetic field and an interconnect inductor portion that is configured to provide an interconnect magnetic field that constructively interferes with the main magnetic field. Accordingly, the constructive interference of the respective magnetic fields provided by the main inductor portion and the interconnect inductor portion can provide an on chip inductor magnetic field that is greater than the main magnetic field.

In further embodiments according to the invention, the on chip spiral inductors can include single or multiple turns. In other embodiments according to the invention, the on chip spiral type inductors include at least one perfect turn. In still other embodiments according to the invention, the spacing between the main inductor portion and the interconnect inductor portion is selected to provide effective constructive interference between the respective magnetic fields. In yet further embodiments according to the invention, the on chip spiral type inductors can include turns having various shapes, such as a rectangular shape, a circular shape, an irregular shape. Other shapes can be used.

As an illustration of the problem appreciated by the inventor, FIG. 4 is a plan view that illustrates a conventional open-type inductor 400. In particular, the open-type inductor 400 includes portions that generate opposing magnetic fields that can destructively interfere with a magnetic field generated by a main portion of the inductor. As is understood by those skilled in the art, a current 403 is provided in a main portion 405 of the inductor 400 via interconnect portions 410 and 415. In particular, during a cycle, the current 403 can be provided to the main portion 405 via the interconnect portion 410 whereas current 403 is provided from (or away from) the main portion 405 via the interconnect portion 415. It will be understood that although the current 403 is shown in FIG. 4 as flowing in one direction, the current direction may alternate in opposite directions in different cycles, such as when the current is an alternating current.

The current 403 in the interconnect portions 410 and 415 and in the main portion 405 generate associated magnetic fields. In particular, the interconnect portions 410 and 415 generate respective magnetic fields 411 and 416 and adjacent portions 420 and 425 of the main portion 405 of the inductor 400 generate respective magnetic fields 421 and 426 that oppose magnetic fields 411 and 416. As appreciated by the present inventor, the magnetic fields generated by the interconnect portions 410 and 415 and the adjacent portions 420 and 425 destructively interfere with one another.

FIG. 5 is a plan view of an on chip spiral type inductor 500 according to some embodiments of the invention. In particular, the on chip spiral type inductor 500 includes a single-turn main inductor portion 505 that defines an inner region 510 of the inductor 500 that is inside the main inductor portion 505. The inductor 500 also includes an interconnect inductor portion 515 that is in an outer region that is outside the main inductor portion 505.

The interconnect inductor portion 515 includes an input path 520 that extends from the outer region to the main inductor portion 505 and is configured to provide current to the main inductor portion 505 in a direction as shown in FIG. 5A. The interconnect inductor portion 515 further includes an output path 530 that extends from the main inductor portion 505 to the outer region and is configured to conduct current from the main inductor portion 505 away from the inductor 500. Although the input and output paths included in the interconnect inductor portion 515 are described herein as conducting current to and from the main inductor portion 505 respectively, it will be understood that these portions can also conduct current in the opposite direction such as when the current is an alternating current. Therefore, the terms input and output are provided for ease of reference and are not used in an absolute sense.

The input path 520 includes a portion electrically coupled to the main inductor portion 505 that extends beneath the output path 530 (i.e., an underpass). Similarly, the output path 530 includes a portion that is electrically coupled to the main inductor portion 505 which extends above the input path 520 (i.e., an overpass). As shown in FIG. 5A, portions of the input and output paths 520, 530 extend parallel to adjacent portions of the main inductor portion 505. For example, as shown in FIG. 5A, adjacent portions of the input path 520 and the main inductor portion 505 (indicated by the reference designator 535) extend parallel to one another. Similarly, adjacent portions of the output path 530 and the portion of the main inductor portion 505 (indicated by the reference designator 540) extend parallel to one another. Accordingly, the parallel portions of the main portion 505 and the interconnect portion 515 generate respective magnetic fields that constructively interfere to produce a magnetic field that is greater than the magnetic field produced by the main portion 505 itself.

Furthermore, the spacing between these parallel portions of the main portion 505 and the interconnect portion 515 can be selected so that the respective magnetic fields provided by the input and output paths and the main inductor portions effectively combine to produce a greater magnetic field. In some embodiments according to the invention, a width W1 of the adjacent portion of the main portion 505 is greater than a spacing W2 between the adjacent portions. It will also be understood that the widths of the portions of the input and output paths which overpass/underpass one another can be about equal to one another.

In operation, a current 550 is introduced into the on chip spiral type inductor 500 via the input path 520 which produces an associated magnetic field designated as $B_i$ which has a direction shown in FIG. 5A. The current 550 is provided from the input path 520 to the main inductor portion 505 and is conducted through the portion of the main inductor portion 505 adjacent to the output path 530 and around a single turn of the main portion 505 to the portion adjacent to input path 520. The current 550 in the adjacent portions of the main portion 505 produce respective magnetic fields $B_{M1}$ and $B_{M2}$ having the directions shown in FIG. 5A.

The current 550 is conducted away from the main inductor portion 505 via the output path 530 which produces a corresponding magnetic field $B_o$ having a direction shown in FIG. 5A. According to embodiments of the invention, the magnetic fields $B_i$ and $B_{M2}$ and $B_{M1}$ and $B_o$ constructively interfere with one another so as to provide an increased magnetic field for the on chip spiral type inductor 500.

FIGS. 5B and 5C are cross-sectional views taken along lines I-I' and II-II' respectively of FIG. 5A. According to FIG. 5B, the cross-sectional view illustrates the portion of the output path 530 which extends above the portion of the input path 520. As shown in FIG. 5B, the portion of the input path 520 which extends beneath the output path is electrically coupled to the remaining portions of the interconnect inductor portion 515 and to the main inductor portion 505 by vias 580 and 585. It will be understood that although only a single via is shown in FIG. 5B, multiple vias can be used.

FIG. 6 is a plan view of an on chip two-turn spiral type inductor 600 according to some embodiments of the invention. In particular, the inductor 600 includes an outer inductor portion 605 that separates an inner region of the inductor 600 from an outer region outside the inductor 600. The inductor 600 also includes an inner inductor portion 610 in the inner region. The interconnect portion 615 provides an input/output path to/from the inductor 600 and the second interconnect portion 625 electrically couples the outer inductor portion 605 to the inner inductor portion 610.

As shown in FIG. 6, the interconnect portion 615 includes an underpass portion that extends beneath an overpass portion thereof and an overpass portion that extends above the underpass portion thereof. Similarly, the second interconnect portion 625 includes an underpass portion that extends beneath an overpass portion thereof and an overpass portion that extends above the underpass portion thereof to electrically couple the outer inductor portion 605 to the inner inductor portion 610. It will be understood that the inner inductor portion 610 includes a center point 635 (or virtual ground) that represents a portion of the inductor 600 around which a voltage controlled oscillator circuit coupled to the inductor 600 can be symmetric. In other words, the inductor 600 can be included in a VCO circuit so that the center point 635 is the symmetrical point for the VCO circuit. The symmetry associated with the center point 635 is defined by the number of times that the current carried in the inductor 600 passes over or under another portion of the inductor before and after the center point 635. For example, as shown in FIG. 6, current provided at the interconnect portion 615 extends is conducted to the center point 635 via two overpass portions to reach the center point 635 whereas the current is conducted via two underpass portions of the inductor 600 after passing the center point 635.

Portions of the input/output paths 620 extend parallel to adjacent portions of the outer inductor portions 605 so that the respective magnetic fields combine constructively with one another. A spacing W3 between a parallel portion of an input/output path of the interconnect portion 615 and an adjacent portion of the outer inductor portion 605 can be equal to a spacing W4 between the adjacent portion of the outer inductor portion 605 and an adjacent portion of the inner inductor portion 610. Furthermore, a width W5 of a conductor used to form the inductor (such as the adjacent portion of the outer inductor portion 605) can be greater than W3 and W4.

FIG. 7 is a plan view of an on chip two-turn spiral type inductor 700 according to some embodiments of the invention. The inductor 700 shown in FIG. 7 is similar to that shown in FIG. 6, however, the inductor 700 can provide improved symmetry relative to inductor 600 as the number of overpass portions and underpass portions through which the current is conducted before reaching a center point 735 is equal to the number of overpass portions and underpass portions through which the current is conducted after passing the center point 735.

In particular, the inductor 700 includes an outer inductor portion 705 that separates an inner region of the inductor 700 from an outer region outside the inductor 700. The inductor 700 also includes an inner inductor portion 710 in the inner region. The interconnect portion 715 provides an input/output path to/from the inductor 700 and the second interconnect portion 725 electrically couples the outer inductor portion 705 to the inner inductor portion 710.

As shown in FIG. 7, current provided to the inductor 700 passes through an overpass portion (of the interconnect portion 715) and an underpass portion (of the interconnect portion 725) before reaching the center point 735 whereas the current passes through an overpass portion (of the interconnect portion 725) and an underpass portion (of the interconnect portion 715) after the center point 735. Accordingly, the current is conducted to the center portion 735 via an equal number of overpass and underpass portions and the current is conducted from the center portion 735 via the same number of overpass and underpass portions. Therefore, the inductor 700 provides improved symmetry than the inductor 600.

Portions of the input/output paths 720 extend parallel to adjacent portions of the outer inductor portions 705 so that the respective magnetic fields combine constructively with one another. A spacing W3 between a parallel portion of the input/output paths 720 of the interconnect portion 715 and an adjacent portion of the outer inductor portion 705 can be equal to a spacing W4 between the adjacent portion of the outer inductor portion 705 and an adjacent portion of the inner inductor portion 715. Furthermore, a width W5 of a conductor used to form the inductor (such as the adjacent portion of the outer inductor portion 705) can be greater than W3 and W4.

FIG. 8 is a plan view of an on chip three-turn spiral type inductor 800 according to some embodiments of the invention. In particular, the inductor 800 includes an outermost inductor portion 805 that separates an inner region of the inductor 800 from an outer region of the inductor outside the inductor 800. An innermost inductor portion 810 is included in the inner region of the inductor 800. The inductor 800 also includes an intermediate inductor portion 845 between the outermost inductor portion 805 and the innermost inductor portion 810.

A center point 835 of the inductor 800 defines a symmetrical point of the inductor 800 about which a voltage controlled oscillator circuit (or similar type circuit) can operate. As shown in FIG. 8, interconnect portions of the inductor 800 that are used to conduct current to/from the center point 835 include overpass and underpass portions. In particular, an interconnect portion 815 electrically couples current to/from the outermost inductor portion 805 whereas a second interconnect portion 825 electrically couples the outermost inductor portion 805 to the intermediate inductor portion 845. The interconnect portion 815 further includes input/output paths 820 that extend from/to the inductor 800.

Furthermore, a third interconnect portion 855 electrically couples the intermediate inductor portion 845 to the innermost inductor portion 810. Each of the interconnect portions includes an underpass portion and an overpass portion. The underpass portion extends beneath the overpass portion and the overpass portion extends above the underpass portion in each of the interconnect portions. Current is provided to the center point 835 via three underpass portions whereas current is provided away from the center portion 835 via three overpass portions. Portions of the interconnect 815 extend parallel to adjacent portions of the outer inductor portions 805 so that the respective magnetic fields combine constructively with one another to produce a magnetic field that is greater than the magnetic field produced by the main inductor 800 itself. A spacing W3 between a parallel portion of the input/output paths of the interconnect portion 815 and an adjacent portion of the outermost inductor portion 805 can be equal to a spacing W4 between the adjacent portion of the outermost inductor portion 805 and an adjacent portion of the intermediate inductor portion 815. Furthermore, a width W5 of a conductor used to form the inductor (such as the adjacent portion of the outermost inductor portion 805) can be greater than W3 and W4.

FIG. 9 is a plan view of an on chip three-turn spiral type inductor 900 according to some embodiments of the invention. The inductor 900 shown in FIG. 9 is similar to that shown in FIG. 8, however, the inductor 900 can provide improved symmetry relative to inductor 800. In particular, the inductor 900 includes an outermost inductor portion 905 that separates an inner region of the inductor 900 from an outer region of the inductor outside the inductor 900. An innermost inductor portion 910 is included in the inner region of the inductor 900. The inductor 900 also includes an intermediate inductor portion 915 between the outermost inductor portion 905 and the innermost inductor portion 910.

A center point 935 of the inductor 900 defines a symmetrical point of the inductor 900 about which a voltage controlled oscillator circuit (or similar type circuit) can operate. As shown in FIG. 9, interconnect portions of the inductor 900 that are used to conduct current to/from the center point 935 include overpass and underpass portions. In particular, an interconnect portion 915 electrically couples current to/from the outermost inductor portion 905 whereas an interconnect portion 925 electrically couples the outermost inductor portion 905 to the intermediate inductor portion 945. Furthermore, an interconnect portion 955 electrically couples the intermediate inductor portion 945 to the innermost inductor portion 910.

Each of the interconnect portions includes an underpass portion and an overpass portion. The underpass portion extends beneath the overpass portion and the overpass portion extends above the underpass portion in each of the interconnect portions. Furthermore, the number of overpass and underpass portions via which the current is conducted is symmetrical about the center point 935. In particular, current is provided to the center point 935 via two underpass portions and an overpass portion whereas current is provided away from the center portion 935 via two overpass portions and an underpass portion. Moreover, the underpass and overpass portions are arranged in an alternating order. In other words, an underpass portion is followed by an overpass portion and an overpass portion is followed by an underpass portion.

Portions of the input/output paths 920 extend parallel to adjacent portions of the outermost inductor portion 905 so that the respective magnetic fields combine constructively with one another. A spacing W3 between a parallel portion of the input/output paths 920 of the interconnect portion 915 and an adjacent portion of the outermost inductor portion 905 can be equal to a spacing W4 between the adjacent portion of the outermost inductor portion 905 and an adjacent portion of the intermediate inductor portion 945. Furthermore, a width W5 of a conductor used to form the inductor (such as the adjacent portion of the outermost inductor portion 905) can be greater than W3 and W4.

Figure 10:
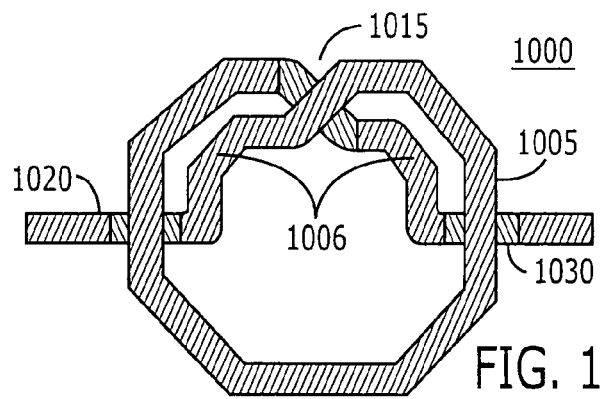
FIG. 10 is a plan view of a single-turn spiral type inductor according to some embodiments of the invention.

FIG. 10 is a plan view of an on chip spiral type inductor 1000 according to some embodiments of the invention. The inductor 1000 includes an outer inductor portion 1005 and an interconnect portion 1015. The an interconnect portion 1015 includes extension portions 1006 inside the outer inductor portion 1005 that follow the contour of the outer inductor portion 1005 and input/output paths 1020/1030 that extend from the extension portions 1006 away from the inductor 1000 to define right angles therewith. The input path 1020 extends beneath a first side of the outer inductor portion 1005, and the output path 1030 extends beneath the outer inductor portion 1005 on a second side of the inductor 1000 opposite the first side. As shown in FIG. 10, the extension portions 1006 extend parallel to adjacent portions of the outer inductor 1005. Accordingly, the parallel portions of the outer inductor 1005 and the extension portions 1006 generate respective magnetic fields that constructively interfere to produce a magnetic field that is greater than the magnetic field produced by the main portion of the inductor 1000 itself. Furthermore, the outer inductor portion 1005 completes a perfect turn (i.e., a complete turn) which can provide an improved magnetic field.

Figure 11:
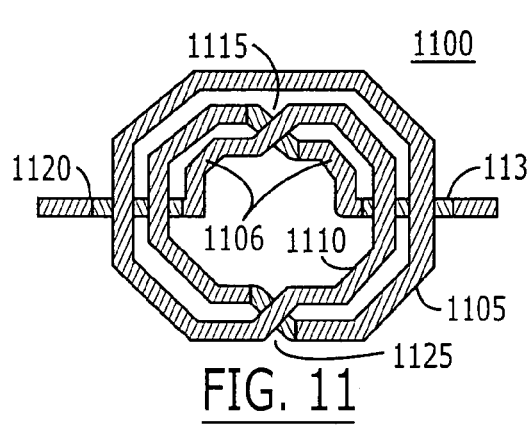
FIG. 11 is a plan view of a two-turn spiral type inductor according to some embodiments of the invention.

FIG. 11 is a plan view of an on chip two-turn spiral type inductor 1100 according to some embodiments of the invention. The inductor 1100 includes an outer inductor portion 1105 that separates an inner region of the inductor 1100 from an outer region of the inductor outside the inductor 1100. As shown in FIG. 11, the outer inductor portion 1105 completes a perfect turn. The inductor 1100 also includes an inner inductor portion 1110 included in the inner region. An input path 1120 extends beneath the outer inductor portion 1105 and the inner inductor portion 1110 on a first side of the inductor 1100. An output path 1130 extends beneath the outer inductor portion 1105 and beneath the inner inductor portion 1110 on a second side of the inductor 1100 opposite the first side. The inductor 1100 further includes extension portions 1106 inside the inner inductor portion 1110 that follow the contour of the inner inductor portion 1110.

As shown in FIG. 11, the input path 1120 is electrically coupled to one of the extension portions 1106 via an underpass portion of an interconnect portion 1115 whereas the output path 1130 is electrically coupled to the other of the extension portions 1106 via an overpass portion of the interconnect portion. Furthermore, the outermost inductor portion 1105 is electrically coupled to the inner inductor portion 1110 by a second interconnect portion 1125 including a respective overpass portion and underpass portion.

Figure 12:
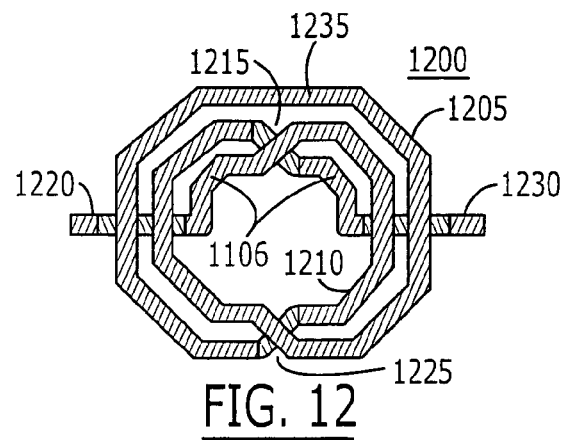
FIG. 12 is a plan view of a two-turn spiral type inductor according to some embodiments of the invention.

FIG. 12 is a plan view of an on chip two-turn spiral type inductor 1200 according to some embodiments of the invention. The inductor 1200 shown in FIG. 12 is similar to that shown in FIG. 11, however, the inductor 1200 can provide improved symmetry relative to inductor 1100.

A first interconnect portion 1215 electrically couples an input path 1220 and an output path 1230 to the inner inductor portion 1210 via an underpass portion and an overpass portion respectively. Furthermore, a second interconnect portion 1225 electrically couples the outer inductor portion 1205 to the inner inductor portion 1210 via an underpass portion and overpass portion respectively. As shown in FIG. 12, the inductor 1200 provides improved symmetry relative to the inductor 1100 as the number of overpass portions and underpass portions through which the current is conducted before reaching a center point 1235 is equal to the number of overpass portions and underpass portions through which the current is conducted after passing the center point 1235.

Furthermore, the outer inductor portion 1005 completes a perfect turn (i.e., a complete turn). Accordingly, the outer inductor portion 1205 can provide an improved magnetic field.

Figure 13:
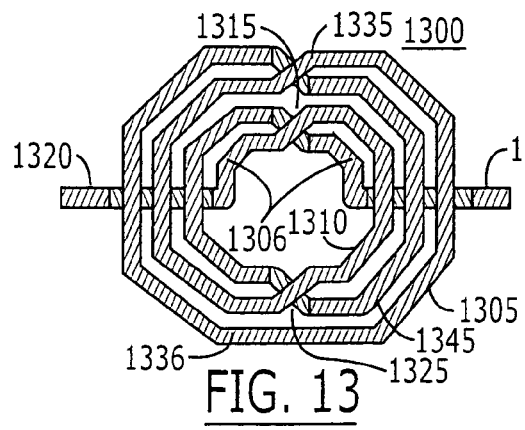
FIG. 13 is a plan view of a three-turn spiral type inductor according to some embodiments of the invention.

FIG. 13 is a plan view of an on chip three-turn spiral type inductor 1300. It will be understood that the configuration of the inductor 1300 in FIG. 13 is similar to the inductor 1400 shown in FIG. 14 with a variation that the inductor 1300 includes an alternating sequence of overpass and underpass portions when current is conducted from an input interconnect portion 1310 to an output interconnect portion 1315. Accordingly, the inductor 1300 can provide an improved symmetry relative to the inductor 1400.

Figure 14:
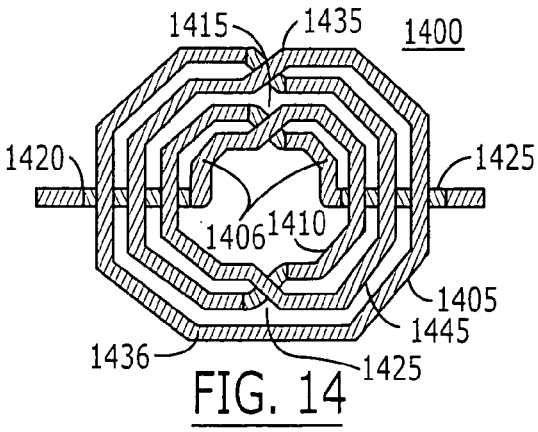
FIG. 14 is a plan view of a three-turn spiral type inductor according to some embodiments of the invention.

FIG. 14 is a plan view of an on chip spiral type inductor 1400 according to some embodiments of the invention. The inductor 1400 includes an outer inductor portion 1405 that separates an inner region of the inductor 1400 from an outer region of the inductor outside the inductor 1400. As shown in FIG. 14, the outer inductor portion 1405 completes a perfect turn thereby provide an improved magnetic field. An inner inductor portion 1410 is included in the inner region of the inductor 1400. The inductor 1400 also includes an intermediate inductor portion 1445 located between the outer inductor portion 1405 and the inner inductor portion 1410. The inductor 1400 also includes extension portions 1406 inside the inner inductor portion 1410 that follow the contour of the inner inductor portion 1410. An input path 1420 extends beneath the outer, intermediate, and inner inductor portions 1405, 1445, and 1410 respectively. It is electrically coupled to the inner inductor portion 1420 via an underpass portion of a first interconnect portion 1415. The output path 1420 extends beneath the outer inductor portion 1405, the intermediate inductor portion 1445, and beneath the inner inductor portion 1410 and is electrically coupled to the inner inductor portion 1410 via an overpass portion of the first interconnect portion 1415.

Figure 15:
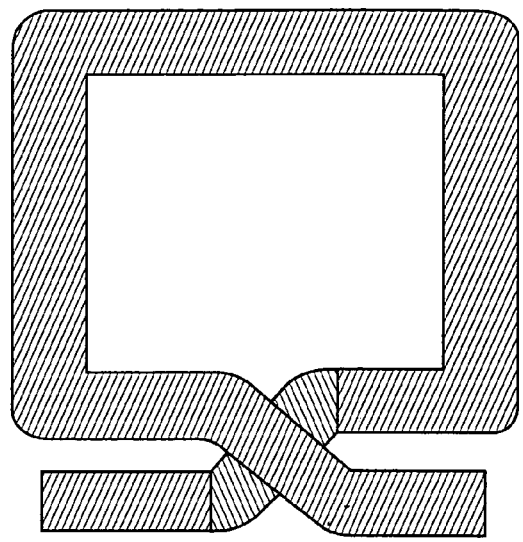
FIG. 15 is a plan view of a single-turn spiral type inductor having a symmetrical rectangular shape according to some embodiments of the invention.
Figure 16:
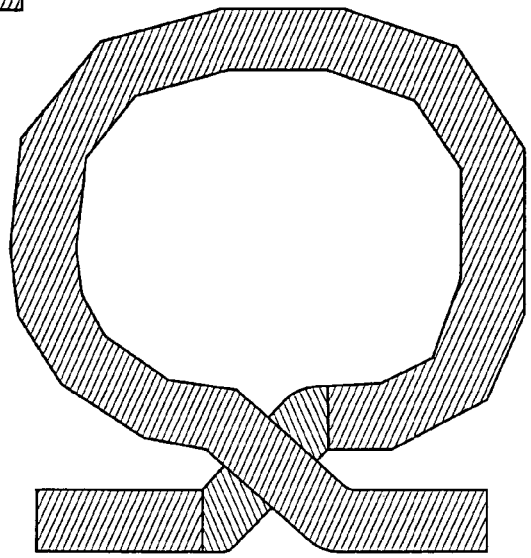
FIG. 16 is a single-turn spiral type inductor having a symmetrical circular shape according to some embodiments of the invention.
Figure 17:
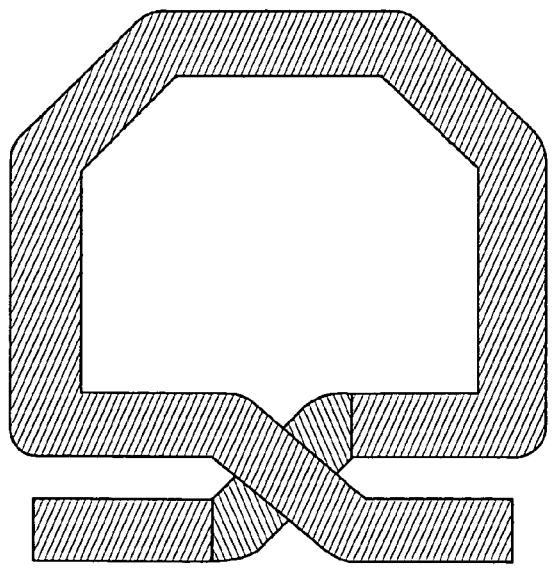
FIG. 17 is a plan view of a single-turn spiral type inductor having an irregular shape according to some embodiments of the invention.

It will be understood that although the embodiments described and illustrated herein are shown as having essentially a circular shape, embodiments according to the invention can utilize other shapes such as a rectangular shape shown in FIG. 15, a circular shape shown in FIG. 16, and/or an irregular shape shown in FIG. 17. Other shapes may be used.

Figure 18:
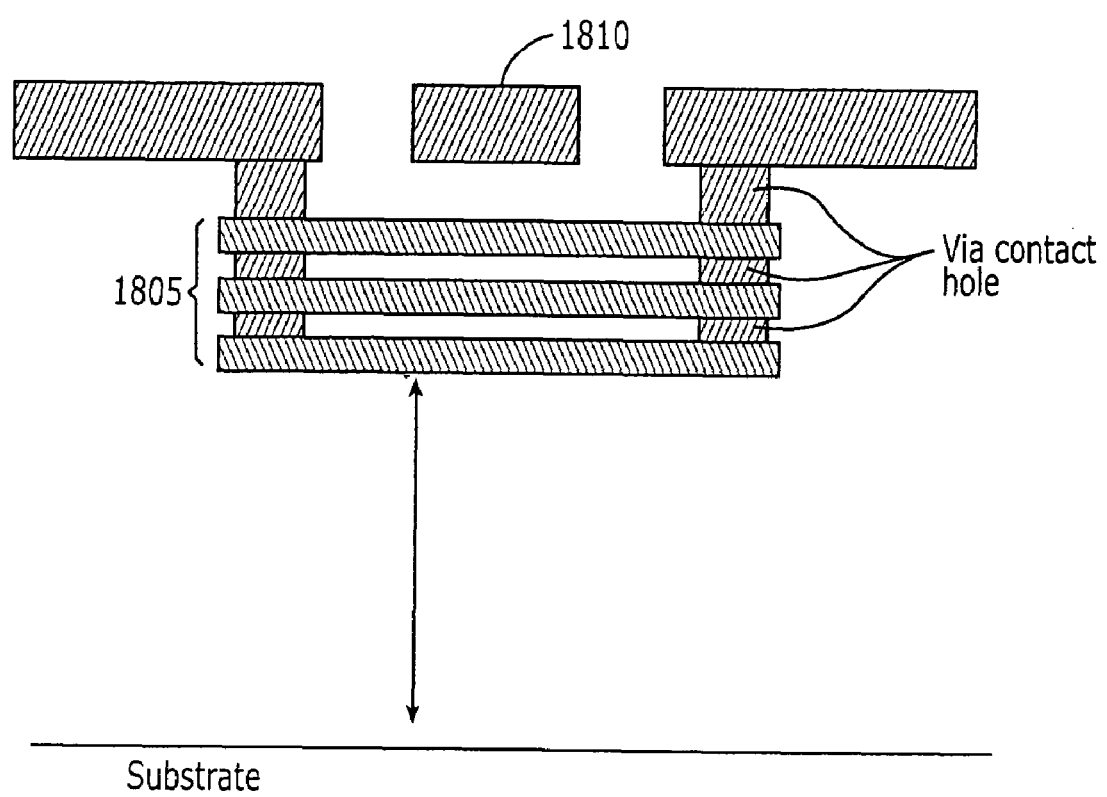
FIG. 18 is a cross-sectional view of an overpass and underpass portions of a spiral type inductor according to some embodiments of the invention.

FIG. 18 is a cross-sectional view that illustrates a multi-layered underpass structure according to some embodiments of the invention. As shown in FIG. 18, the underpass structure 1805 include multiple layers each of which extends beneath the overpass portion 1810. The multi-layer structure in the underpass portion 1805 can reduce the resistance of the underpass portion and can reduce asymmetry by using an existing interconnection process and structure of semiconductor integration process.

Figure 19:
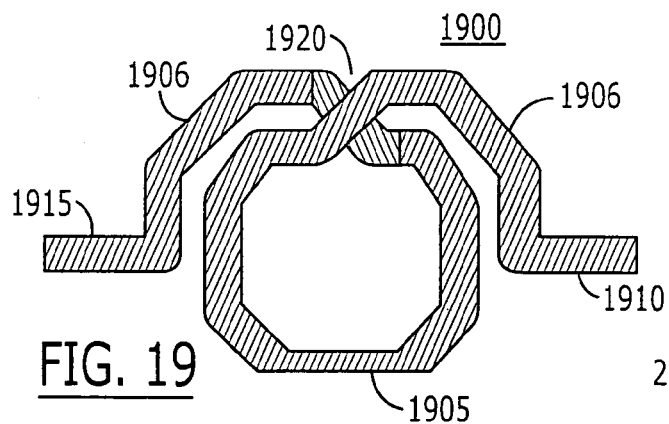
FIG. 19 is a plan view of a single-turn spiral type inductor according to some embodiments of the invention.

FIG. 19 is a plan view of a single-turn spiral type inductor 1900 according to some embodiments of the invention. The inductor 1900 includes an outer inductor portion 1905, extension portions 1906 outside the outer inductor portion 1905 that follow the contour of the outer inductor portion 1905, and an interconnect portion 1915 that electrically couples the outer inductor portion 1905 to the extension portion 1906. As shown in FIG. 19, the extension portions 1906 extend parallel to adjacent portions of the main inductor portion 1905. Accordingly, the parallel portions of the main portion 1905 and the extension portions 1906 generate respective magnetic fields that constructively interfere to produce a magnetic field that is greater than the magnetic field produced by the main portion 1905 itself. The inductor 1900 also includes input and output paths 1920 and 1930 that extend from the extension portions 1906 away from the inductor 1900 on opposite side thereof. In contrast to some other embodiments according to the invention, the input and output paths 1920 and 1930 that extend away from the inductor 1900 do not extend beneath the inductor 1900 on the opposite sides thereof as shown, for example, in FIGS. 10-14.

Figure 20:
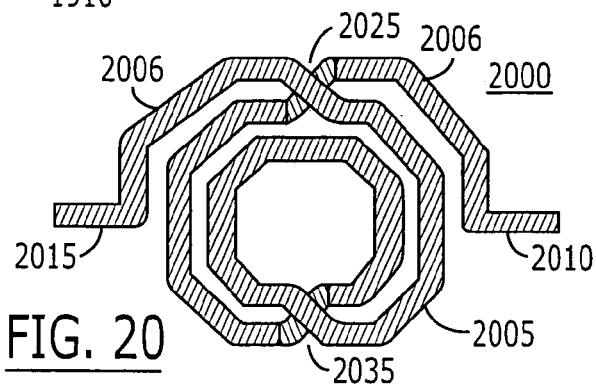
FIG. 20 is a plan view of a two-turn spiral type inductor according to some embodiments of the invention.

FIG. 20 is a plan view of a two-turn spiral type inductor 2000 according to some embodiments of the invention. The inductor 2000 includes an outer inductor portion 2005 that separates an inner region of the inductor 2000 from an outer region of the inductor outside the inductor 2000 and an inner inductor portion 2010 included in the inner region. The inductor 2000 also includes extension portions 2006 outside the outer inductor portion 2005 that follow the contour of the outer inductor portion 2005, a first interconnect portion 2015 that electrically couples the outer inductor portion 2005 to the extension portion 2006, and a second interconnect portion 2025 that electrically couples the inner inductor portion 2010 to the outer inductor portion 2005. The first and second interconnection portions 2015 and 2025 including respective overpass portion and underpass portions. The inductor 2000 also includes input and output paths 2020 and 2030 that extend from the extension portions 2006 away from the inductor 2000 on opposite side thereof.

Figure 21:
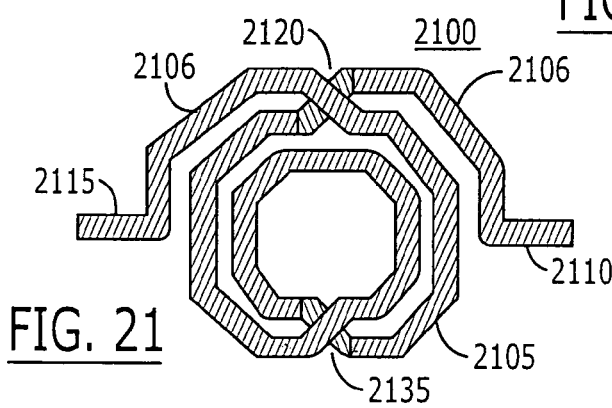
FIG. 21 is a plan view of a two-turn spiral type inductor according to some embodiments of the invention.

Current is provided to the center point via two underpass portions whereas current is provided away from the center portion via two overpass portions. It will be understood that the underpass and overpass portions can be arranged in an alternating order as shown for example in FIG. 21, which may provide improved symmetry for the inductor 2000.

Figure 22:
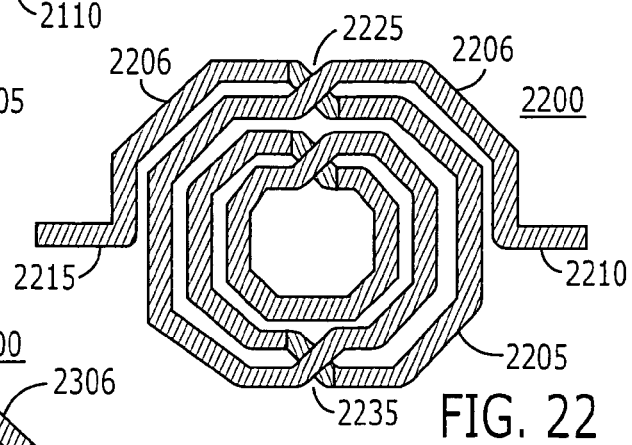
FIG. 22 is a plan view of a three-turn spiral type inductor according to some embodiments of the invention.
Figure 23:
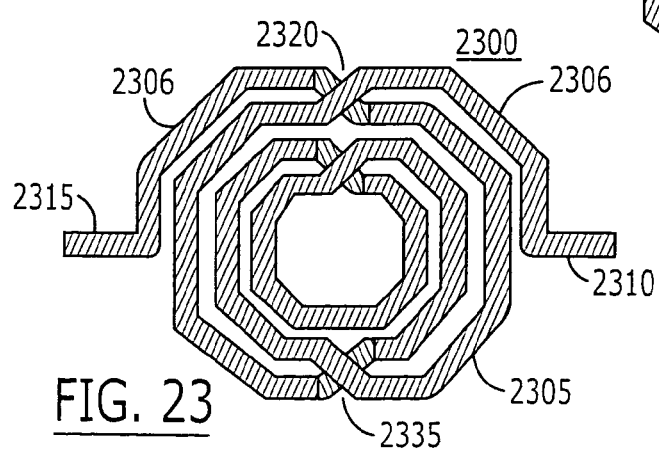
FIG. 23 is a plan view of a three-turn spiral type inductor according to some embodiments of the invention.

FIG. 22 is a plan view of a three-turn spiral type inductor 2200 according to some embodiments of the invention. Embodiments according to the invention illustrated in FIG. 22 are similar to those illustrated, for example, in FIG. 20. In contrast to FIG. 20, however, the inductor 2200 includes three turns rather than two. Accordingly, the inductor 2200 includes three interconnection portions. Each of the interconnection portions includes an overpass portion and an underpass portion. Moreover, the number of overpass portions and underpass portions via which current is conducted to and away from a center point of the inductor 2200 is equal. In particular, as shown in FIG. 2200, current is conducted to the center point via three consecutive overpass portions and is conducted away form the center point via three consecutive underpass portions. In other embodiments according to the invention, the overpass and underpass portions may be arranged in an alternating order as show, for example, in FIG. 2300.

As disclosed herein, embodiments according to the invention can provide on chip spiral type inductors. In some embodiments according to the invention, the on chip spiral type inductors include a main inductor portion that is configured to provide a main magnetic field and an interconnect inductor portion that is configured to provide an interconnect magnetic field that constructively interferes with the main magnetic field. Accordingly, the constructive interference of the respective magnetic fields provided by the main inductor portion and the interconnect inductor portion can provide an on chip inductor magnetic field that is greater than the main magnetic field.

In further embodiments according to the invention, the on chip spiral inductors can include single or multiple turns. In other embodiments according to the invention, the on chip spiral type inductors include at least one perfect turn. In still other embodiments according to the invention, the spacing between the main inductor portion and the interconnect inductor portion is selected to provide effective constructive interference between the respective magnetic fields. In yet further embodiments according to the invention, the on chip spiral type inductors can include turns having various shapes, such as a rectangular shape, a circular shape, an irregular shape.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. An on-chip inductor comprising:
   a main inductor portion configured to provide a main magnetic field of an inductor defining an inner region of the inductor and an outer region that is outside an outermost spiral of the inductor; and
   an interconnect inductor portion in the outer region, electrically coupled to the main inductor portion, that is configured to provide an interconnect magnetic field that constructively combines with the main magnetic field, wherein the interconnect portion comprises;
   a first path configured to provide current to/from the main inductor portion and a first magnetic field; and
   a second path configured to provide current to/from the main inductor portion and a second magnetic field that does not destructively combine with the first magnetic field.

2. An on-chip inductor according to claim 1 wherein the interconnect magnetic field and the main magnetic field provide an inductor magnetic field that is greater than the main magnetic field.

3. An on-chip inductor according to claim 1 wherein the first path includes an overpass portion that extends above an underpass portion included in the second path.

4. An on-chip inductor according to claim 3 wherein the second path further comprises a portion that conducts current to/from the main inductor portion in a direction that is parallel to the direction of current in an adjacent portion of the main inductor portion that is coupled to the first path.

5. An on-chip inductor according to claim 4 wherein the first path further comprises a portion that conducts current to/from the main inductor portion in a direction that is parallel to the direction of current in an adjacent portion of the main inductor portion that is coupled to the second path.

6. An on-chip inductor according to claim 5 wherein a width of the adjacent portion is greater a spacing between the portion and the adjacent.

7. An on-chip inductor according to claim 3 wherein the underpass portion of the second path is coupled to the main portion by at least one via.

8. An on-chip inductor according to claim 3 wherein a thickness of the underpass portion is about equal to a thickness of the overpass portion.

9. An on-chip inductor according to claim 3 wherein the underpass portion of the second path comprises multiple spaced-apart layers.

10. An on-chip inductor according to claim 3 wherein the overpass portion and the underpass portion define a right angle relative to one another.

11. An on-chip inductor according to claim 3 wherein respective resistances of the first and second paths are about equal.

12. An on-chip inductor according to claim 1 wherein the main inductor portion comprises one of a circular shape, a rectangular shape, and an irregular shape.

13. An on-chip inductor according to claim 3, wherein the main inductor portion comprises an outer inductor portion and wherein the overpass and underpass portions comprise a first overpass portion and a first underpass portion respectively, further comprising:
   an inner inductor portion in the inner region and coupled to the outer inductor portion;
   a second overpass portion coupled to the inner inductor portion and the outer inductor portion; and
   a second underpass portion coupled to the inner inductor portion and the outer inductor portion and extending beneath the second overpass portion.

14. An on-chip inductor according to claim 13 wherein the first overpass portion and the second underpass portion are consecutively arranged in a path through which current is conducted to a center point of the inductor included in the inner inductor portion.

15. An on-chip inductor according to claim 13 wherein the first underpass portion and the second overpass portion are consecutively arranged in a path through which current is conducted to a center point of the inductor included in the inner inductor portion.

16. An on-chip inductor according to claim 13 wherein the first overpass portion and the second overpass portion are consecutively arranged in a path through which current is conducted to a center point of the inductor included in the inner inductor portion.

17. An on-chip inductor according to claim 3 wherein the main inductor portion comprises an outer inductor portion, further comprising:
at least one one-turn inner inductor portion in the inner region and coupled to the outer inductor portion, wherein each inner inductor portion includes an interconnect portion respectively wherein the interconnect portions comprise respective overpass and underpass portions.

18. An on-chip inductor according to claim 17 wherein current is conducted in the inductor via alternating overpass and underpass portions.

19. An on-chip inductor according to claim 17 wherein current is conducted in the inductor via a consecutive plurality of underpass portions and a consecutive plurality of overpass portions.

20. An on-chip inductor according to claim 1, wherein end portions of the first and second paths extend in opposite directions.

21. An on-chip spiral type inductor comprising:
a main inductor portion that separates an inner region of the inductor from an outer region outside the main inductor portion;
an input interconnect portion coupled to the main inductor portion that extends to the outer region, the input interconnect portion configured to provide current to/from the main inductor portion and to provide a first magnetic field; and
an output interconnect portion coupled to the main inductor portion that extends to the outer region, the output interconnect portion configured to provide current to/from the main inductor portion and to provide a second magnetic field that does not destructively combine with the first magnetic field;
wherein the one of the input interconnect portion and the output interconnect portion extends above the other of the input interconnect portion and the output interconnect portion; and
wherein the first and second magnetic fields combine with a main magnetic field generated by the main inductor portion to provide a combined magnetic field that is greater than the main magnetic field.

22. An on-chip inductor according to claim 21 wherein the input interconnect portion further comprises a portion that conducts current to the main inductor portion in a direction that is parallel to the direction of current in an adjacent portion of the main inductor portion that is coupled to the input interconnect portion.

23. An on-chip inductor according to claim 21 wherein the output interconnect portion further comprises a portion that conducts current to the main inductor portion in a direction that is parallel to the direction of current in an adjacent portion of the main inductor portion that is coupled to the output interconnect portion.

24. An on-chip inductor according to claim 21 wherein the one of the input interconnect portion and the output interconnect portion comprises:
a path configured to provide current to/from the main inductor portion, wherein the path includes an underpass portion that extends beneath an overpass portion included in the other of the input interconnect portion and the output interconnect portion.

25. An on-chip inductor according to claim 24 wherein the path is coupled to the main inductor portion by at least one via.

26. An on-chip inductor according to claim 21 wherein a thickness of the underpass portion is about equal to a thickness of the overpass portion.

27. An on-chip inductor according to claim 21 wherein the underpass portion comprises multiple spaced-apart layers.

28. An on-chip inductor according to claim 21 wherein the main inductor portion comprises an outer inductor portion, further comprising:
at least one one-turn inner inductor portion in the inner region and coupled to the outer inductor portion, wherein each inner inductor portion includes an interconnect portion respectively, wherein the interconnect portions comprise respective overpass and underpass portions.

29. An on-chip inductor according to claim 28 wherein current is conducted in the inductor via alternating overpass and underpass portions.

30. An on-chip inductor according to claim 28 wherein current is conducted in the inductor via a consecutive plurality of underpass portions and a consecutive plurality of overpass portions.

* * * * *